(12) United States Patent
Kahl et al.

(10) Patent No.: US 7,708,827 B2
(45) Date of Patent: May 4, 2010

(54) HIGHLY PURE, REPLACEABLE WEAR INSERT AND PROCESS FOR MANUFACTURING THE SAME

(75) Inventors: Hans-Georg Kahl, Rheinbach (DE); Jürgen Kessel, Bad Honnef (DE); Helmut Schmitz-Gräpp, Bonn (DE)

(73) Assignee: SGL Carbon SE, Wiesbaden (DE)

( * ) Notice: Subject to any disclaimer, the term of this patent is extended or adjusted under 35 U.S.C. 154(b) by 347 days.

(21) Appl. No.: 10/351,124

(22) Filed: Jan. 24, 2003

(65) Prior Publication Data

US 2003/0148104 A1    Aug. 7, 2003

(30) Foreign Application Priority Data

Feb. 5, 2002    (DE) ................. 102 04 468

(51) Int. Cl.
*C30B 15/10* (2006.01)
(52) U.S. Cl. .............. 117/13; 117/14; 117/15; 117/200; 117/208; 117/213
(58) Field of Classification Search ............ 117/13, 117/14, 15, 200, 208, 213, 218, 900
See application file for complete search history.

(56) References Cited

U.S. PATENT DOCUMENTS 3,719,608 A * 3/1973 Olstowski ............ 252/506
4,704,257 A * 11/1987 Tomizawa et al. ......... 117/203
4,888,242 A * 12/1989 Matsuo et al. ............ 428/408
5,194,198 A * 3/1993 von Bonin et al. .......... 264/42

FOREIGN PATENT DOCUMENTS

| DE | 131640 | 7/1978 |
| DE | 40 07 053 A1 | 9/1990 |
| JP | 58-190892 | * 11/1983 |
| JP | 4-21509 | * 1/1992 |
| WO | 98/48085 | 10/1998 |

* cited by examiner

*Primary Examiner*—Robert M Kunemund
(74) *Attorney, Agent, or Firm*—Laurence A. Greenberg; Werner H. Stemer; Ralph E. Locher

(57) ABSTRACT

A highly pure, replaceable wear insert and a process for manufacturing the same use a group of materials which is suitable for meeting the requirements of high temperature semiconductor technology processes and is chosen at the same time for producing thin layers or components therefrom. The materials are compacted and purified at high temperatures in compression molds and the products so produced are put to their intended use. The substantially thin-walled and crucible-shaped, always highly pure components, which are predominantly made of expanded graphite, are employed as a wear insert for protecting graphitic support crucibles from reactive attack by quartz glass crucibles in semiconductor technology processes at temperatures above 500° C.

17 Claims, 4 Drawing Sheets

HIGHLY PURE, REPLACEABLE WEAR INSERT AND PROCESS FOR MANUFACTURING THE SAME

BACKGROUND OF THE INVENTION

Field of the Invention

The invention relates to a process for the production of a high purity replaceable wear insert of expanded graphite with or without additives of carbon or graphite, such as e.g. textile carbon fiber products, for protecting graphite support crucibles from reactive attack by quartz glass crucibles in processes of semiconductor technology with temperatures above 500° C. The invention also relates to a replaceable wear insert produced by the process.

High temperatures are, in many cases, used in the production and processing of very pure materials such as are required e.g. in the semiconductor industry. The aids which are used therefor must accordingly be highly pure and above all also be resistant to high temperatures. A material which best meets those requirements is graphite. However, a disadvantage of graphite components which must withstand such conditions is their limited service life, which is to be attributed to attack by chemically active, usually gaseous substances, such as, for example, oxygen, silicon monoxide, carbon dioxide or even solid or high viscosity silicon dioxide, at the high temperatures which prevail. That limited service life also manifests itself in an adverse manner in the expenditure for the particular processes carried out, e.g. during pulling of silicon monocrystals and the quartz glass crucibles which are used therefor and are in direct contact with graphite.

The quartz glass crucibles no longer have a sufficient mechanical stability at the high temperatures being used and require a support in order to retain their shape. Crucibles of a special extra-pure graphite which are still completely dimensionally stable under those conditions are used for that support function.

There has been no lack of attempts to develop graphite materials and components produced therefrom, as well as with additional layers, for the intended uses described above in order to improve the service life of components and devices produced in that way. That applies, in particular, to support crucibles of graphite, as well as with protective layers.

A possible route is described in International Publication No. WO 98/48085, corresponding to U.S. patent application Ser. No. 08/842,182, filed Apr. 3, 1997. Layers of material between the quartz glass crucible and the graphite support crucible are provided to suppress reactions of those two crucibles (crucible materials) with one another. Such layers are built up from high-melting metals or carbides, oxides or silicides thereof. The layers are applied to the graphite. The thermodynamic reaction rates of the various reaction partners are shown in detail therein.

Another route taken was the coating of the usual graphite varieties with carbon fiber-reinforced carbon (CFRC). German Published, Non-Prosecuted Patent Application DE 40 07 053 A1 describes the lining of graphite support crucibles which have two or more segments and which are distinguished in that they are provided on their inner surface, facing the quartz glass crucible, on the upper edge and on the contact surfaces of the segments with, in each case, a protective layer of CFRC.

However, there are indications that the products/crucibles produced in that way are not employed in practice. According to International Publication No. WO 98/48085, corresponding to U.S. patent application Ser. No. 08/842,182, filed Apr. 23, 1997, additional apparatuses are necessary to produce the layers, which moreover are to be applied uniformly. Furthermore, in that process metals are introduced into the crystal pulling system, which is extremely sensitive with respect to its purity requirements, and dope the silicon monocrystals in an undesirable manner and lead to a lower or non-tolerable quality of the silicon monocrystals.

In the case of German Published, Non-Prosecuted Patent Application DE 40 07 053 A1, the CFRC has not withstood the reactive attack of the quartz glass crucible better than the usual graphite varieties. It is noted that the cost of the CFRC is considerable.

The production costs of the highly pure, as well as coated, graphite components, and the operating expenditure attributed to those components, which results, for example, from the service life of the support crucible during pulling of the crystals, are a noteworthy parameter in the processes in which they are employed. If it were possible to prolong the service life of such high-quality graphite components during the course e.g. of the Czochralski process, there would be a considerably technical and operational benefit in that prolongation.

It is shown by the prior art cited above that layers which adhere directly to the support crucibles can be realized. However, it is also shown that such layers do not yet meet operational requirements, e.g. during pulling of crystals.

Coatings on the quartz glass crucibles which have the task of reducing the reactive attack of the graphite support crucible are not known. That is probably attributable to several reasons: 1. A high purity is to be achieved in the layers and the materials used must dope neither the quartz glass crucibles nor the silicon melts to be treated therein. 2. The production processes for such layers on the quartz glass crucibles require a considerable expenditure, see International Publication No. WO 98/48085, corresponding to U.S. patent application Ser. No. 08/842,182, filed Apr. 23, 1997, cited above in connection with graphitic support crucibles. 3. Since the quartz glass crucibles deform under the load of the silicon melt at the high temperatures during pulling of the crystals, it cannot be expected without more ado that a coating on the quartz glass crucibles undergoes that deformation at the same time. Rather, it is to be expected that a coating will then tear. The protection of the quartz glass crucible at least in part is thus no longer guaranteed.

If neither protective layers firmly adhering to the substrate "graphite support crucible" nor those firmly adhering to the substrate "quartz glass crucible" have led to satisfactory results with respect to the reactive attack of the graphite support crucible by the quartz glass crucible, a search is to be made for a suitable, thin intermediate layer which is independent of the substrates or a suitable, thin intermediate crucible. That search is divided into two important sections: 1. Discovery of suitable materials and 2. Development of a suitable production process.

SUMMARY OF THE INVENTION

It is accordingly an object of the invention to provide a highly pure, replaceable wear insert and a process for manufacturing the same, which overcome the hereinafore-mentioned disadvantages of the heretofore-known products and processes of this general type.

One of the objects of the present invention has been to discover a material, materials or material groups for layers which are not firmly bonded to the graphite support crucible or to the quartz glass crucible and which, as materials and in the form of relatively thin, reaction-inhibiting layers, meet the requirements of processes in semiconductor technology.

Another object has been to discover a process for the production of a highly pure replaceable expanded graphite wear insert. Additives to the expanded graphite produced from carbon or graphite, such as e.g. carbon fiber textile products, can be of advantage in this case.

The search for a material or a group of materials is determined by several requirements:
1. The material or the group of materials must not introduce any foreign or doping elements into the (high temperature) semiconductor technology process.
2. The material or the group of materials must not increase the wear (the oxidation or the reduction) of the beneficial components of the (high temperature) semiconductor technology process (quartz glass crucible and graphite support material) which are introduced.
3. It must be seen that the material or the group of materials can be produced in thin layers and with an economically acceptable expenditure.
4. The material or the group of materials must result in layers which are such as to inhibit the reactions between the quartz glass crucible and graphite support crucible.
5. Quartz glass crucibles for the semiconductor technology processes have outer diameters on the order of 70 cm. Thin layers of the material or the group of materials identified must consequently also be feasible and manageable in that size.

The first requirement limits the number of possible materials quite considerably. Thus e.g. the use of oxides, such as is proposed in International Publication No. WO 98/48085, corresponding to U.S. patent application Ser. No. 08/842,182, filed Apr. 23, 1997, carbides or nitrides of high-melting metals will be avoided because those metals are also possible as a doping element for the semiconductor material.

Those materials which have already appeared to date in semiconductor technology processes, namely carbon, silicon and oxygen, will expediently be used.

A few materials formed from those elements carbon, silicon and oxygen, largely fulfill the second requirement. Others are not suitable: A highly reactive material formed of the elements silicon and oxygen, namely silicon monoxide, is to be ruled out because that compound is present in gaseous form at a temperature above 1,2000° C., which temperature is exceeded in semiconductor processes. Carbon-oxygen compounds are also excluded because of their gaseous state. Materials formed of carbon and carbon-silicon compounds are to be considered more closely.

Regarding the Third Requirement:

Group A) Materials based on carbon fibers are generally suitable for the production of thin-walled, readily manageable components. The scale of kilogram prices for such materials is exceptionally wide because of very greatly differentiated degrees of refinement of the carbon fiber products.

Group B) Materials based on foils of expanded graphite are also generally suitable for the production of thin-walled, readily manageable components. The depth of refinement of the materials and products is very much lower in that case, and the raw material, natural graphite of suitable quality, is about ten times less expensive than a carbon fiber, which is the basis of the materials of group A).

Group C) Other available types of carbon or graphite are not suitable for the production of thin layers. Those materials are to be counted among ceramic materials, the distinguishing feature of which is brittleness. Relatively large, flat components, dishes or crucibles would accordingly break under even a relatively low mechanical load, possible even during production. The same applies to uncommon modifications of carbon, such as e.g. pyrocarbon.

Group D) Materials based on carbon and silicon, in particular silicon carbide, are also counted as ceramic materials, with what was stated above regarding brittleness applying in that case as well. The handicap of brittleness could be bypassed by the development and use of a new class of materials: with carbon fiber-reinforced silicon carbide (CSiC). Nevertheless, the expenditure for the production of (thin-walled) components of CSiC is currently still unusually high, so that the use of that material class for the present object is not recommended for economic reasons.

Regarding the Fourth Requirement:

The above-mentioned group A) is a very diverse group of materials. It ranges from felts through nonwovens, tapes, woven fabrics or knitted fabrics to the CFRC described above in connection with German Published, Non-Prosecuted Patent Application DE 40 07 053 A1. It has now been found in preliminary experiments that felts, in addition to having a low resistance to oxidation due to the nature of the fibers or binder, inhibit reactions between the quartz glass crucible and graphitic support crucible to too little a degree. Analyses have shown that decomposition products of the quartz glass crucible are to be found in the pore system of the support crucible when felts are used as the wear insert. The same applies to nonwovens, tapes, woven fabrics or knitted fabrics formed of carbon fibers. Arguments for CFRC are dealt with in the following section regarding the fifth requirement. Group A is excluded because of the finding of too low an inhibition of the wear reactions of the graphitic support crucible. Group B) of the materials based on foils of expanded graphite is suitable in principle, since the foils are so dense, depending on the degree of compaction, that they can suppress permeation of decomposition products of the quartz glass crucible to the graphitic support crucible. Groups C) and D) are not considered further, since they do not adequately meet the fourth requirement.

Regarding the Fifth Requirement:

Group A):

In German Published, Non-Prosecuted Patent Application DE 40 07 053 A1 cited above, a material based on carbon fibers, namely CFRC, was described as a layer firmly bonded to the graphitic support crucible. CFRC is without doubt suitable for producing large, thin-walled, strong and therefore readily manageable free-standing layers and components without a supporting substrate. Nevertheless, because of the nature of the carbon binder, the resistance of CFRC to oxidation is lower than that of specially tailored fine-grain electrographites. The high kilogram price of CFRC of about ten to fifty times the price of fine-grain electrographites runs counter to the use of CFRC as a wear insert. In addition, there is the argument in the fourth requirement, according to which the materials based on carbon fibers suppress the wear reactions of the graphitic support crucible too little because of permeation of decomposition products of the quartz glass crucible to the graphitic support crucible. That also applies to CFRC, since CFRC has a high open porosity, depending on the degree of compaction. That porosity is indeed lower than that of the other fiber products, such as felts, nonwovens etc., but significantly higher than e.g. that of conventional electrographites.

Group B):

It is prior art to produce relatively large, thin-walled, free-standing components from a foil of expanded graphite.

Articles from sealing technology, such as e.g. flat seals, are produced as mass-produced products with external diameters of between e.g. 20 mm and 1,500 mm. The materials used are either pure expanded graphite or material combinations of expanded graphite with metal sheets and/or plastics materials.

It is only the materials which are formed of expanded graphite alone that meet the requirements of the processes in semiconductor technology, e.g. because of heat resistance. Three-dimensionally shaped components are comparatively rare, as measured by the above-mentioned mass-produced products.

The following material groups meet the five requirements mentioned:
- materials based on expanded graphite; and
- some materials based on the combination of expanded graphite and carbon fibers.

The first object mentioned above for the present invention is thus achieved. With the first object of the invention in view, there is provided a replaceable wear insert, comprising expanded graphite containing less than 500 ppm of ash constituents.

The second object mentioned above, of discovering a process for the production of a highly pure replaceable wear insert from expanded graphite, appears trivial. The pliability of expanded graphite is exceptionally good, so that it seems easy to produce thin, readily manageable layers, where possible in the form of an intermediate layer or an intermediate crucible, for use between the quartz glass crucible and the support crucible. However, that exceptionally good pliability of expanded graphite applies only to the commercially available types of material, the ash value of which, in accordance with DIN (German Industrial Standard) 51903, ranges from four percent down to 0.15 percent or from 40,000 down to 1,500 ppm. However, the ash value of a graphite foil material to be employed for semiconductor technology should be below 500 ppm. This means that the graphite foil material must be purified again. Such a purification belongs to the prior art in graphite technology and takes place above 2,000° C. in an atmosphere which contains a halogen or in an atmosphere which contains halogen-containing gases. However, if a graphite foil material has undergone such a purification treatment, a decisive change in the material is found: It has lost its pliability and has become brittle. If that purified material is introduced into a mold as a thin foil and attempts are made to adapt the foil to the contour of the mold by careful shaping, the brittle material tears. It is thus not possible to produce thin, coherent, readily manageable layers, where possible in the form of a contoured intermediate layer or an intermediate crucible, from purified graphite foil.

With the second object of the invention in view, there is provided a process of producing a highly pure replaceable wear insert of expanded graphite for protecting graphitic support crucibles from reactive attack by quartz glass crucibles in semiconductor technology processes with temperatures above 5000° C., which comprises the following steps:
- in a first step, the expanded graphite is introduced into a compression mold of adequate stability including at least two parts, as a rule an upper and a lower ram;
- in a second step the compression mold is closed with a pressure of at least 10 MPa and not more than 100 MPa and the expanded graphite is thus compacted and shaped during closing;
- in a third step the compacted and shaped expanded graphite component is removed from the compression mold and introduced into another mold having the same geometry as the shaping surfaces and being formed of heat-resistant material, e.g. electrographite or carbon fiber-reinforced carbon;
- in a fourth step the other mold formed of heat-resistant material, e.g. electrographite or carbon fiber-reinforced carbon, is purified, with the compacted and shaped expanded graphite component contained therein, at temperatures above 2,000° C. in an atmosphere containing a halogen or in an atmosphere containing halogen-containing gases; and
- in a fifth step the compacted, shaped, purified and now brittle expanded graphite component produced in this way is removed from the other mold and put to its intended use as a wear insert.

The process can be simplified under certain conditions if only low pressing pressures are required to compact the expanded graphite, if it is present e.g. in a particularly low bulk density and the pressing pressures required do not destroy the graphitic mold employed or if a high-strength compression mold of CFRC is available if more severe compaction is necessary.

With the objects of the invention in view, there is therefore also provided a process for producing a highly pure replaceable wear insert of expanded graphite for protecting graphitic support crucibles from reactive attack by quartz glass crucibles in semiconductor technology processes with temperatures above 500° C., which comprises the following steps:
- in a first step the expanded graphite is introduced into a heat-resistant compression mold formed of e.g. electrographite or carbon fiber-reinforced carbon including at least two parts, as a rule an upper and a lower ram;
- in a second step the mold is closed with a pressure of at least 10 MPa and not more than 100 MPa and the expanded graphite is thus compacted and shaped during closing;
- in a third step the mold formed of heat-resistant material, e.g. electrographite or carbon fiber-reinforced carbon, is purified, with the compacted and shaped component of expanded graphite contained therein, at temperatures above 2,000° C. in an atmosphere containing a halogen or in an atmosphere containing halogen-containing gases; and
- in a fourth step the compacted, shaped, purified and now brittle expanded graphite component produced in this way with or without additives is removed from the mold and put to its intended use as a wear insert.

In the alternative processes described herein, expanded graphite is predominantly employed in the form of foil or foil blanks. Since the compression mold, on one hand, has partial surfaces which are preferably orientated perpendicular to the pressing direction, and on the other hand, has partial surfaces which are orientated virtually parallel to the pressing direction, different pressing pressures prevail on the different partial surfaces during closing of the compression mold. The expanded graphite employed is consequently compacted to different degrees and the highly pure replaceable wear insert thus acquires different strengths at the particular partial surface. In order to counteract this, it is occasionally appropriate to cover the various partial surfaces of the compression mold with foil or foil blanks precompacted to different degrees.

If the foils are not sufficient at some points of the high purity replaceable wear insert to be produced, there is the possibility of supplementing the amount of material in the compression mold by flocks or flakes of expanded graphite of very low bulk density.

In these cases, two or even several starting substances of the same class of material, but with different bulk densities, are thus used. It is possible to fill the mold only with flakes of expanded graphite.

As a result of the first object mentioned for the present invention, two groups of materials which meet the requirements have been mentioned. In addition to the second group, materials based on expanded graphite, the third group, namely materials based on the combination of carbon fibers and expanded graphite, is mentioned. Materials based on the combination of carbon fibers and expanded graphite are also suitable for processing by the two processes described above with five or four steps, respectively.

In these cases two different classes of materials (expanded graphite and carbon fibers) are used. It is possible for each class of material to contain several starting substances with different characteristics (e.g. bulk densities of the expanded graphite or type of textile make-up of the fibers).

The molds employed for compaction of the expanded graphite, and if required expanded graphite to which a proportion of carbon fibers has been added, as a rule include an upper ram and a lower ram. When the complete mold is closed, the two rams are separated by a gap of substantially constant width. A component which is compression-molded in the complete mold and is to be used as a wear insert after passing through the entire process, thus has a wall thickness of substantially uniform thickness. However, it is possible for particular requirements to be imposed on the stability and manageability of the replaceable wear insert, which demand partial thickening of the wall thickness of the wear insert. The gap between the upper ram and the lower ram with the complete mold closed is then to be enlarged in part. The shaping surface of one ram is substantially convex and the shaping surface of the other ram is substantially concave, according to the desired geometry of the replaceable wear insert. The convex shape of one ram corresponds to the external surface of the quartz glass crucible.

In order to produce a highly pure replaceable wear insert, a material of at least one class of material is used, in order to thus cover the shaping surface of the lower ram of the complete mold. As explained, various starting substances of the same class of material or even various classes of material including several starting substances can alternatively be used. The covering of the shaping surface of the lower ram is closed, that is to say gaps are to be avoided between the sections of material.

The shaping surface of the lower ram is covered to the extent of more than 90% in each case. A quartz glass crucible for the Czochralski process is not filled completely with silicon melt during the process, and for this reason the upper edge of the quartz glass crucible is not subjected to load by the liquid pressure of the melt. Consequently, it is not necessary to support this upper edge by a graphite crucible. The highly pure replaceable wear insert does not cover the upper edge of the quartz glass crucible.

According to the processes described above, the compression-molded component is purified while stationary in a graphite mold. For this purpose, the mold with the compression-molded component is heated up to more than 2,000° C. in an atmosphere which contains a halogen or in an atmosphere containing halogen-containing gases, and is left at this temperature for some time. The ash value of the mold and the compression-molded component after the treatment is less than 500 ppm.

The advantages of the production and use of highly pure replaceable wear inserts can be summarized as follows:

A chain of graphites for graphite support crucibles for quartz glass crucibles in Czochralski processes has heretofore been developed over a period of many years. The quality of those graphites with respect to strength and resistance to oxidation has been increased more and more. It has only been possible to achieve an increase in the material properties from time to time with increasing expenditure. That continued development is now no longer necessary.

In contrast: Since the migration of the decomposition products of the quartz glass crucible to the graphite support crucible is largely suppressed with the highly pure replaceable wear insert which can be inserted between the quartz glass crucible and the graphite support crucible, and practically no reactive attack of the support crucible takes place, inexpensive graphite qualities can be used to produce the support crucible.

Other features which are considered as characteristic for the invention are set forth in the appended claims.

Although the invention is illustrated and described herein as embodied in a highly pure, replaceable wear insert and a process for manufacturing the same, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
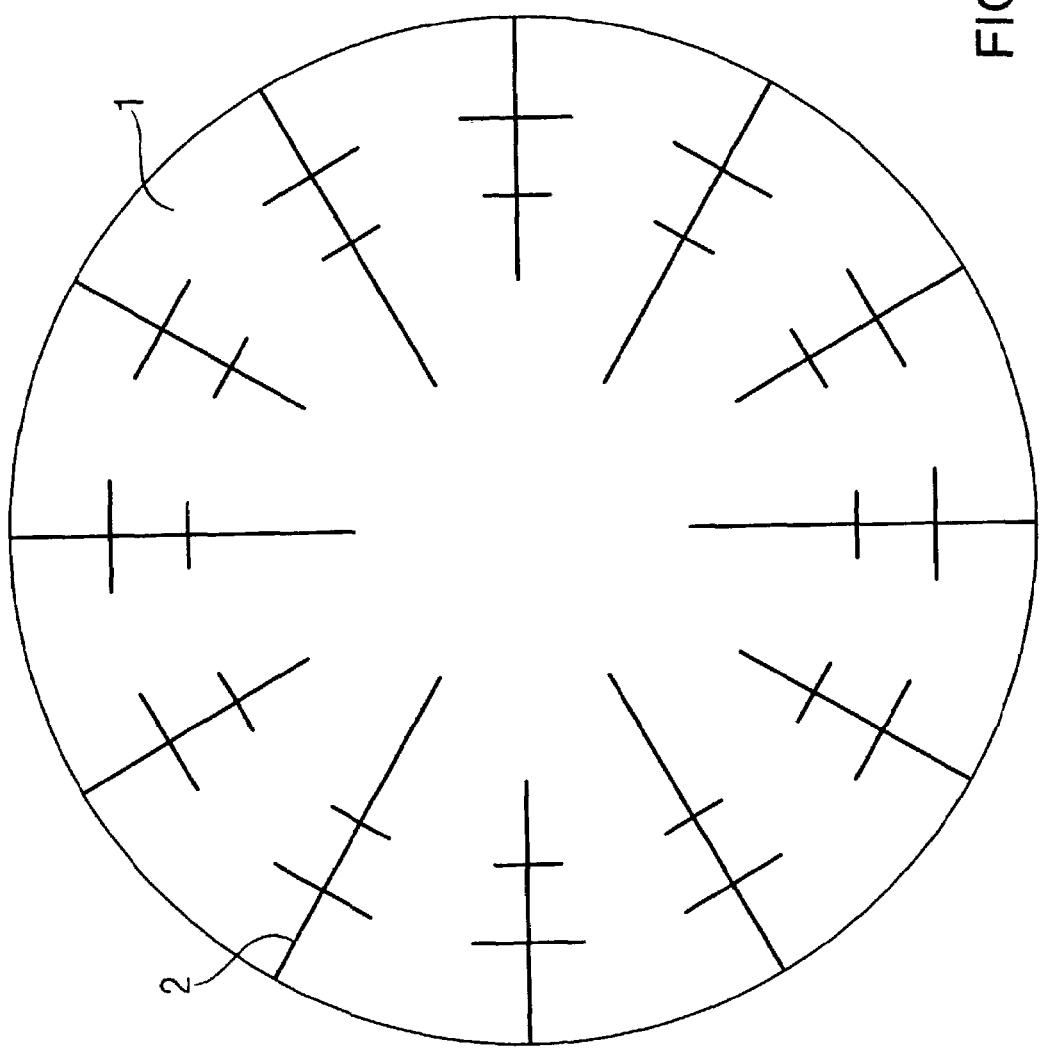
FIG. 1 is a diagrammatic, plan view of a circular blank 1 of a foil of expanded graphite with cuts 2.

Referring now to the figures of the drawings in detail and first, particularly, to FIG. 1 thereof, there is seen a circular blank 1 of a foil of homogeneous expanded graphite material. The expanded graphite material is suitable for laying as a closed layer in a contoured mold, after cutting in patterns having radial and tangential cuts 2.

Figure 2A:
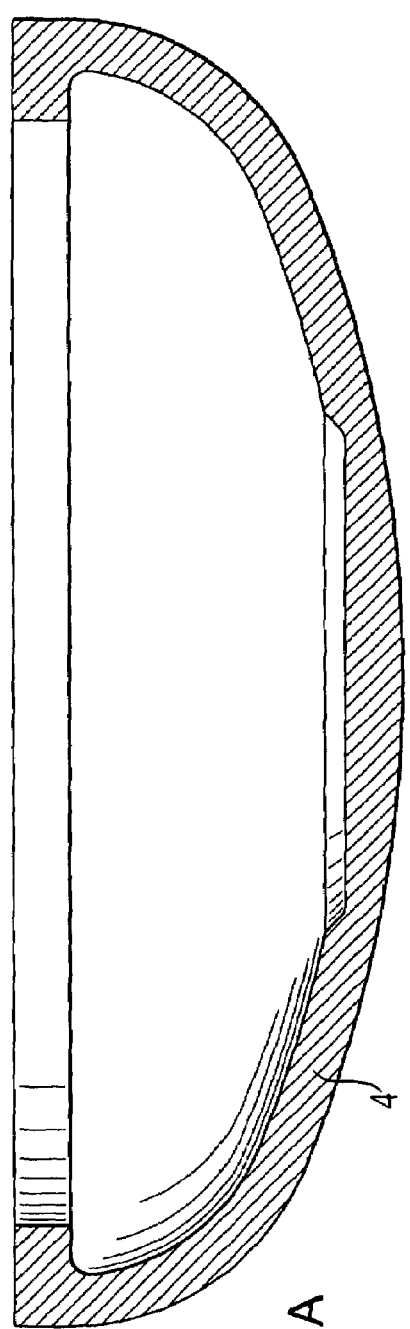
FIG. 2a is a sectional view of an upper ram of a compression mold.
Figure 2B:
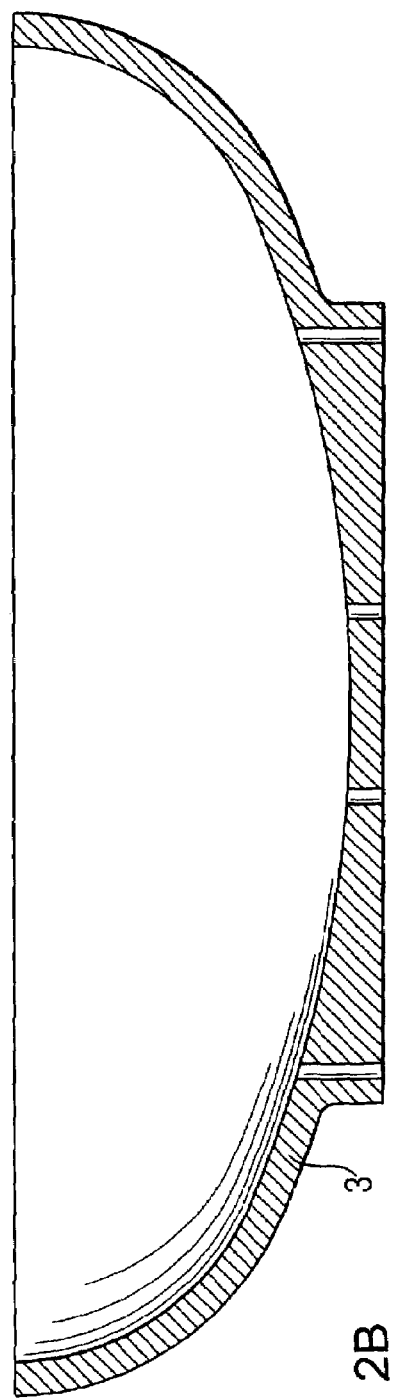
FIG. 2b is a sectional view of a lower ram of a compression mold.

A compression mold which can accommodate the necessary molding or closing forces is to be produced from a material that can be readily worked. The material of this compression mold can be chosen in such a way that it endures a high temperature treatment of more than 2,000° C., but does not have to meet this criterion. The compression mold is expediently composed of an upper ram or stamp 4 shown in FIG. 2a, and a lower ram or stamp 3 shown in FIG. 2b. The mold must be suitable for shaping and/or compacting expanded graphite with additives according to the given types of material.

Figure 3A:
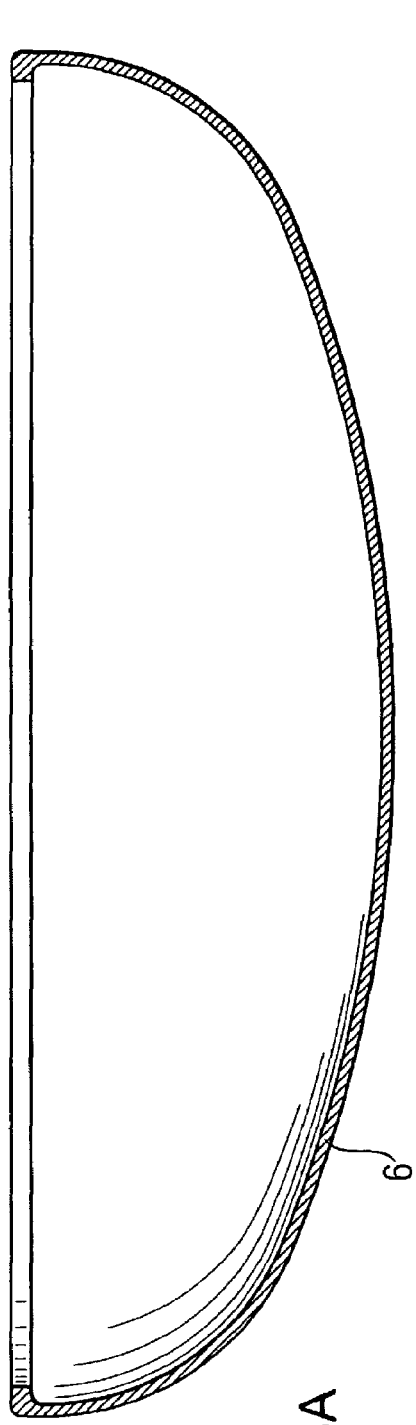
FIG. 3a is a sectional view of an upper part of a mold of heat-resistant material for a purification step.
Figure 3B:
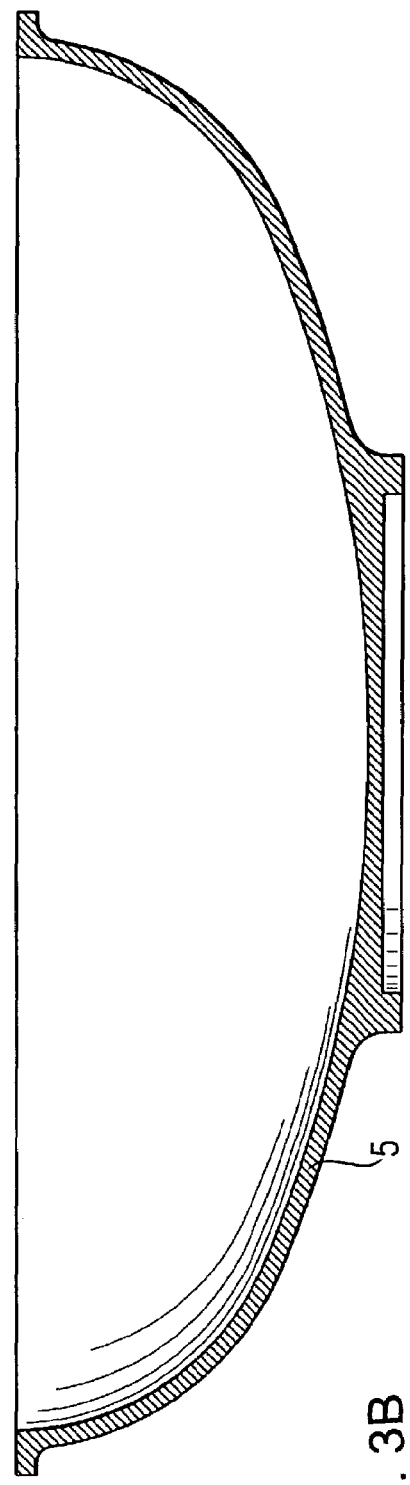
FIG. 3b is a sectional view of a lower part of a mold of heat-resistant material for the purification step.

Another mold having an upper part 6 shown in FIG. 3a, and a lower part 5 shown in FIG. 3b, has the first task not of impressing a contour on the raw material but of maintaining a contour, given by the compression mold, of a component of expanded graphite and its additives during a high temperature process of purification. The mold must therefore have a high heat resistance. A second task is to introduce as little contamination as possible into the purification process. This task is achieved well if the mold itself is highly pure, thin-walled and of low mass.

However, it is possible to use only one mold, in which case the mold having the parts 5, 6 is a compression mold made of temperature-resistant material.

Figure 4:
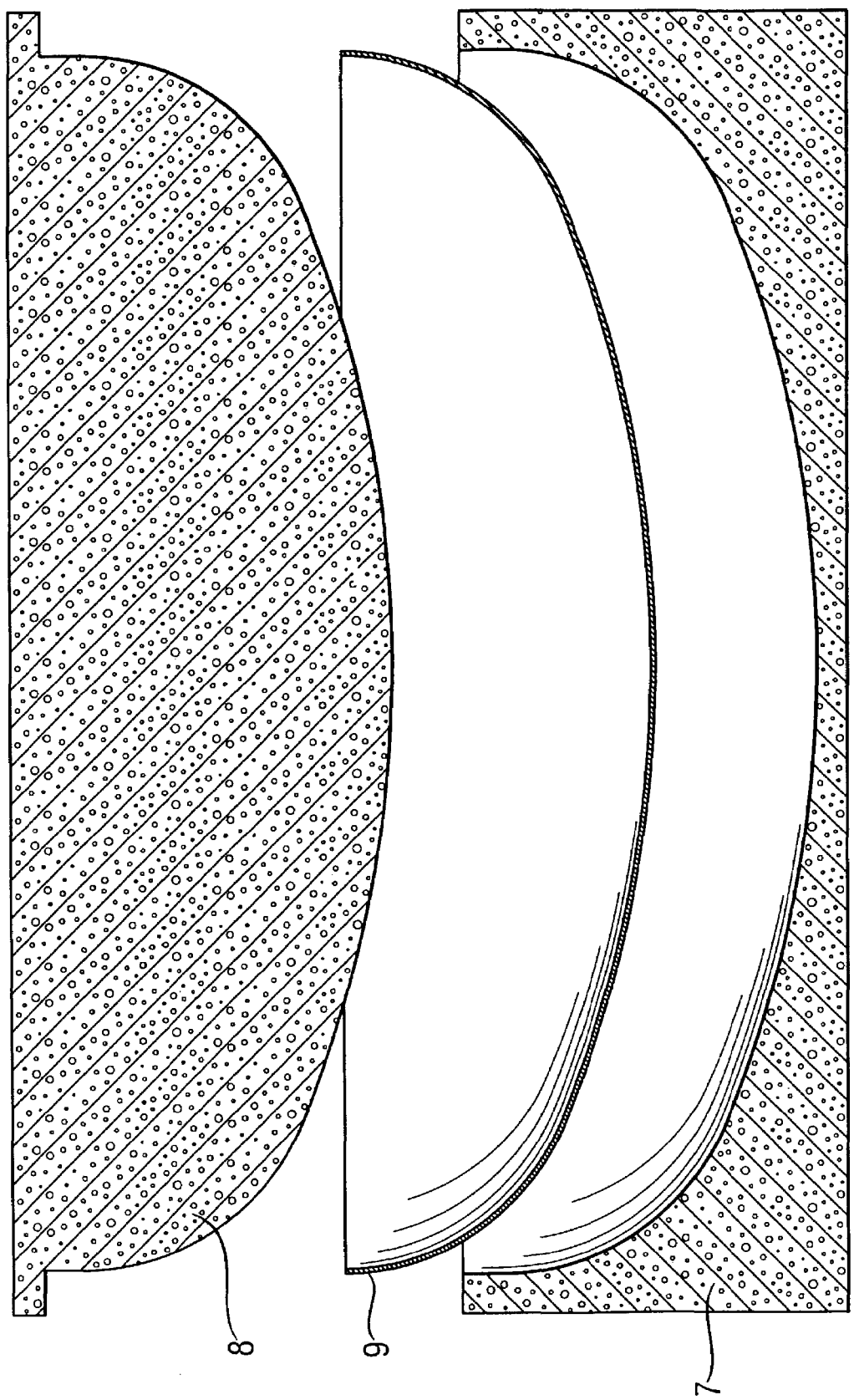
FIG. 4 is a sectional view of a lid and a base of a packing unit, between which an idealized wear insert is illustrated in section.

A packing unit 7, 8 shown in FIG. 4 fulfils two tasks:
1. It protects a wear insert, which is very flexible and easy to crease, from mechanical damage during transportation and storage; and
2. It protects the highly pure wear insert from contamination during transportation and storage.

An idealized wear insert 9 is additionally illustrated in section between a lid 8 and a base 7 of the packing unit.

The produciblity of a wear insert according to the invention is demonstrated below by way of an exemplary embodiment:

A foil of expanded graphite, commercially available as roll goods, e.g. SIGRAFLEX® F02510Z, manufactured by SGL CARBON AG, D-86405 Meitingen, Germany, in a thickness of 0.25 mm was employed. The material was envisaged for a crucible having a diameter of 28 inches. A graphitic support crucible had an internal diameter of 28 inches in a cylindrical part and a quartz glass crucible to be inserted therein had an external diameter about 1 mm smaller. A circular blank 1 having a diameter of 920 mm was cut out of the foil of expanded graphite. A pattern of radial and tangential cuts 2 was introduced manually into the circular blank 1 with knives and with the aid of a template, see FIG. 1. The circular blank 1 of expanded graphite prepared in this way was laid in the lower part or lower ram 3 of a compression mold, see FIG. 2b. On one hand, the cuts in the circular blank 1 allowed the foil of expanded graphite to be laid in the lower ram 3 practically without folds, but with overlapped parts of the foil, in particular at the periphery of the mold. On the other hand, the cut of the circular blank 1 and the placing of the circular blank 1 in the lower ram 3 ensured that the expanded graphite formed a closed layer and no gaps existed between parts of the graphite foil. The complete mold was closed and the inserted expanded graphite was shaped with the upper ram 4 of the compression mold. The total closing force exerted by the upper ram 4 was approximately 2,000 N.

The mold material was isostatically compacted graphite, and the wall thickness of the mold was about 20 mm, which was adequate for the above-mentioned total closing force.

After opening of the compression mold, the shaped expanded graphite was removed manually as a coherent unit from the lower mold of the compression mold and laid in the considerably thinner-walled lower part of another graphite mold 5, which was envisaged for the process step of purification.

This other mold was closed with the aid of the likewise very thin-walled upper part 6 without applying an additional pressure. The shaping contours of the compression mold and the purification mold were identical.

The other mold (purification mold) had the task of stabilizing the shaped coherent unit of expanded graphite in the desired contour and of bringing it in this way through the purification process, which proceeds at above 2,000° C. The low wall thickness of this mold was provided due to the fact that with the thin-walled mold:
1. as little (mold) mass as possible had to be heated up; and
2. as little contamination as possible was introduced into the purification process with the material of the mold.

After the purification process, the shaped coherent unit of expanded graphite was removed from the purification mold. It was then possible to describe the component of expanded graphite as a "wear insert" 9 for the Czochralski process.

While observing extreme cleanliness, the wear insert was introduced manually into a packing unit which was made of foam and in turn had the same contours as the compression mold and the purification mold. The surfaces of the foam components were coated with a polyethylene foil so that the packing unit having the base 7 and the lid 8 picked up no contamination from the environment, especially from foam bubbles.

We claim:

1. A replaceable wear insert, comprising:
    a substantially bowl-shaped part of expanded graphite manufactured by the following steps:
        placing the expanded graphite in a compression mold formed of at least two parts having molding surfaces substantially defining a bowl shape with a geometry matching a geometry of an outer surface of a quartz glass crucible for which the wear insert is provided;
        closing the compression mold with a pressure of 10 to 100 Mpa to produce a substantially bowl-shaped compressed and molded part;
        removing the compressed and molded part from the compression mold and placing the compressed and molded part in another mold made of temperature-resistant material and having the same, substantially bowl-shaped geometry as the molding surfaces; and
        treating the compressed and molded part at over 2000° C. in the other mold in a halogen-containing atmosphere, cleaning and embrittling the substantially bowl-shaped compressed and molded part;
    said substantially bowl-shaped part containing less than 500 ppm of ash constituents;
    the replaceable wear insert not being bonded to a crucible, having a substantially uniform wall thickness and being adapted to be inserted in a graphitized support crucible for protecting the graphitized support crucibles against oxidative attack by quartz glass crucibles and acting as a sacrificial layer during semiconductor technology processes at temperatures exceeding 500° C.

2. A replaceable wear insert, comprising:
    a substantially bowl-shaped part of expanded graphite manufactured by the following steps:
        placing the expanded graphite in a compression mold formed of at least two parts substantially defining a bowl shape with a geometry matching a geometry of an outer surface of a quartz class crucible for which the wear insert is provided and made of temperature-resistant material;
        closing the compression mold with a pressure of 10 to 100 Mpa to produce a substantially bowl-shaped compressed and molded part; and
        then subjecting the compressed and molded part to treatment in the compression mold in a halogen-containing atmosphere at over 2000° C. cleaning and embrittling the substantially bowl-shaped compressed and molded part;
    said substantially bowl-shaped part containing less than 500 ppm of ash constituents;

the replaceable wear insert not being bonded to a crucible, having a substantially uniform wall thickness and being adapted to be inserted in a graphitized support crucible for protecting the graphitized support crucibles against oxidative attack by quartz glass crucibles and acting as a sacrificial layer during semiconductor technology processes at temperatures exceeding 500° C.

3. The replaceable wear insert according to claim 1, wherein the bowl-shaped part is formed for placement in a quartz glass crucible such that the quartz glass crucible is not completely covered by the replaceable wear insert.

4. The replaceable wear insert according to claim 2, wherein the bowl-shaped part is formed for placement in a quartz glass crucible such that the quartz glass crucible is not completely covered by the replaceable wear insert.

5. In combination with a graphitized support crucible and a quartz glass crucible having an outer surface with a given geometry, a replaceable wear insert protecting the graphitized support crucible against oxidative attack by the quartz glass crucible and acting as a sacrificial layer during semiconductor technology processes at temperatures exceeding 500° C., the replaceable wear insert comprising:
 a part of expanded graphite manufactured by the following steps:
  placing the expanded graphite in a compression mold formed of at least two parts having molding surfaces matching the given geometry of the outer surface of the quartz glass crucible for which the wear insert is provided;
  closing the compression mold with a pressure of 10 to 100 Mpa to produce a compressed and molded part;
  removing the compressed and molded part from the compression mold and placing the compressed and molded part in another mold made of temperature-resistant material and having the same geometry as the molding surfaces; and
  treating the compressed molded part at over 2000° C. in the other mold in a halogen-containing atmosphere, cleaning and embrittling the compressed and molded part;
 the replaceable wear insert containing less than 500 ppm of ash constituents and having a shape substantially corresponding to the given geometry of the quartz glass crucible and not completely covering the quartz glass crucible;
 the replaceable wear insert not being bonded to a crucible, having a substantially uniform wall thickness and being adapted to be inserted in the graphitized support crucible.

6. In combination with a graphitized support crucible and a quartz glass crucible having an outer surface with a given geometry, a replaceable wear insert protecting the graphitized support crucible against oxidative attack by the quartz glass crucible and acting as a sacrificial layer during semiconductor technology processes at temperatures exceeding 500° C., the replaceable wear insert comprising:
 a part of expanded graphite manufactured by the following steps:
  placing the expanded graphite in a compression mold formed of at least two parts substantially matching the given geometry of the outer surface of the quartz glass crucible for which the wear insert is provided and made of temperature-resistant material;
  closing the compression mold with a pressure of 10 to 100 Mpa to produce a compressed and molded part; and
  then subjecting the compressed and molded part to treatment in the compression mold in a halogen-containing atmosphere at over 2000° C., cleaning and embrittling the compressed and molded part;
 the replaceable wear insert containing less than 500 ppm of ash constituents and having a shape substantially corresponding to the given geometry of the quartz glass crucible and not completely covering the quartz glass crucible;
 the replaceable wear insert not being bonded to a crucible, having a substantially uniform wall thickness and being adapted to be inserted in the graphitized support crucible.

7. A replaceable wear insert, comprising:
 expanded graphite containing less than 500 ppm of ash constituents, not being bonded to a crucible and formed for placement in a crucible, wherein the wear insert is produced in a compression mold having a geometry matching a geometry of an outer surface of a quartz glass crucible for which the wear insert is provided, and the wear insert has a substantially uniform wall thickness and protects the crucible and acts as a sacrificial layer during semiconductor processing at temperatures above 500° C.

8. The replaceable wear insert according to claim 1, wherein the quartz glass crucibles have an outer diameter on the order of 70 mm.

9. The replaceable wear insert according to claim 2, wherein the quartz glass crucibles have an outer diameter on the order of 70 mm.

10. The combination according to claim 5, wherein the quartz glass crucible has an outer diameter on the order of 70 mm.

11. The combination according to claim 6, wherein the quartz glass crucible has an outer diameter on the order of 70 mm.

12. The replaceable wear insert according to claim 7, wherein the wear insert protects the crucible against quartz glass crucibles having an outer diameter on the order of 70 mm.

13. The replaceable wear insert according to claim 1, wherein the wear insert is adapted to substantially completely cover a bottom of a crucible.

14. The replaceable wear insert according to claim 2, wherein the wear insert is adapted to substantially completely cover a bottom of a crucible.

15. The replaceable wear insert according to claim 5, wherein the wear insert is adapted to substantially completely cover a bottom of a crucible.

16. The replaceable wear insert according to claim 6, wherein the wear insert is adapted to substantially completely cover a bottom of a crucible.

17. The replaceable wear insert according to claim 7, wherein the wear insert is adapted to substantially completely cover a bottom of a crucible.

* * * * *